US006376909B1

(12) United States Patent
Forbes et al.

(10) Patent No.: US 6,376,909 B1
(45) Date of Patent: Apr. 23, 2002

(54) MIXED-MODE STACKED INTEGRATED CIRCUIT WITH POWER SUPPLY CIRCUIT PART OF THE STACK

(75) Inventors: Leonard Forbes, Corvallis, OR (US); Kie Y. Ahn, Chappaqua, NY (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/388,764

(22) Filed: Sep. 2, 1999

(51) Int. Cl.$^7$ ................................................ H01L 23/48

(52) U.S. Cl. ........................ 257/734; 257/777; 257/774; 257/790; 257/737

(58) Field of Search ................................. 257/777, 774, 257/790, 737, 734

(56) References Cited

U.S. PATENT DOCUMENTS

| | | | |
|---|---|---|---|
| 5,202,754 A | * | 4/1993 | Bertin et al. |
| 5,279,988 A | | 1/1994 | Saadat et al. ............... 437/195 |
| 5,583,474 A | | 12/1996 | Mizoguchi et al. ........... 336/83 |
| 5,780,175 A | | 7/1998 | Chen et al. .................. 428/692 |
| 5,801,521 A | | 9/1998 | Mizoguchi et al. ......... 323/282 |

OTHER PUBLICATIONS

Bauer, C.E., "Three Dimensional Multichip Modules", Proceedings of the Technical Program—National Electronic Packaging and Production Conference, NEPCON West '94, 2444, 2001–2005 (1993).

Cardot, F., et al., "Fabrication of a Magnetic Transducer Composed of a High–Density Array of Microelectromagnets with On–Chip Electronics", *Sensors and Actuators A*, 43, 11–16 (1994).

Forbes, L., et al., "Resonant Forward–Biased Guard–Ring Diodes for Suppression of Substrate Noise in Mixed–Mode CMOS Circuits", *Electronics Letters*, 31, 720–721 (Apr., 1995).

Fossum, E.R., "Digital Camera System on a Chip", *IEEE Micro*, 8–15 (May–Jun., 1998).

Ganasan, J.R., "3 D Packaging—Combining Chip on Chip (COC) and Chip on Board (COB) Packages—Process and Design Considerations", Proceedings of 1997 IEEE Electronic Components and Technology Conference, 1210–1213 (1997).

Gong, S., et al., "Techniques for Reducing Switching Noise in High Speed Digital Systems", Proceedings of the 8th Annual IEEE International ASIC Conference and Exhibit, Austin, TX, 21–24 (1995).

Kim, Y., et al., "Surface Micromachined Solenoid Inductors for High Frequency Applications", 1997 International Symposium on Microelectronics, 1–6 (1997).

(List continued on next page.)

*Primary Examiner*—Fetsum Abraham
(74) *Attorney, Agent, or Firm*—Schnegman, Lundberg, Woessner & Kluth, P.A.

(57) ABSTRACT

A mixed-mode integrated circuit (IC) device includes power circuitry formed on an IC die. The power circuitry generates multiple operating voltages. Additional circuitry is formed on other IC dies that are vertically stacked with the first IC die, which serves both as a carrier for the other IC dies and as a silicon interposer on which the power supply and DC-to-DC converter circuits are formed. Coaxial connectors are coupled to the power circuit arrangement and provide each circuit with an appropriate operating voltage. Thus, digital, analog, and radio frequency functions can be incorporated in a single package. Methods of forming the same are similarly included within the scope of the present invention.

33 Claims, 9 Drawing Sheets

OTHER PUBLICATIONS

Makie–Fukuda, K., et al., "Substrate Noise Reduction Using Active Guard Band Filters in Mixed–Signal Integrated Circuits", *IEICE Trans. Fundamentals,* E80–A, 313–320 (Feb., 1997).

Matsumoto, S., et al., "Integration of a Power Supply for System–on–Chip", *IEICE Trans. Fundamentals,* E80–A, 276–282 (Feb., 1997).

McCredie, B.D., et al., "Modeling, Measurement, and Simulation of Simultaneous Switching Noise", *IEEE Transactions on Components, Packaging, and Manufacturing Technology*—Part B, 19, 461–472 (Aug. 1996).

Mimura, T., et al., "System Module: a New Chip–on–Chip Module Technology", Proceedings of 1997 IEEE Custom Integrated Circuit Conference, 439–442 (1997).

Mino, M., et al., "Switching Converter Using Thin–Film Microtransformer with Monolithically Integrated Rectifier Diodes", *IEICE Trans. Electron.,* E80–C, 821–827 (Jun., 1997).

Park, J.Y., et al., "Fully Integrated Micromachined Inductors with Electroplated Anisotropic Magnetic Cores", Thirteenth Annual Applied Power Electronics Conference and Exposition, vol. 1, Conference Proceedings, Anaheim, California, 379–385 (1998).

Senba, N., et al., "Application of 3–Dimensional Memory Module", Proceedings of 1996 International Symposium on Microelectronics, SPIE 2920, 279–284 (1996).

Senthinathan, R., et al., "Reference Plane Parasitics Modeling and Their Contribution to the Power and Ground Path "Effective" Inductance as Seen by the Output Drivers", *IEEE Transactions on Microwave Theory and Techniques,* 42. 1765–1773 (Sep., 1994).

Shibuya, A., et al., "New MCM Composed of D/L Base Substrate, High–Density–Wiring CSP and 3D Memory Modules", Proceedings of 1997 IEEE Electronic Components and Technology Conference, 491–496 (1997).

Stanisic, B.R., et al., "Addressing Noise Decoupling in Mixed–Signal IC's: Power Distribution Design and Cell Customization", *IEEE Journal of Solid–State Circuits,* 30, 321–326 (Mar., 1995).

Su, D.K., et al., "Experimental Results and Modeling Techniques for Substrate Noise in Mixed–Signal Integrated Circuits",*IEEE Journal of Solid–State Circuits,* 28(4), 420–430 (Apr., 1993).

Tsukada, T., et al., "Approaches to Reducing Digital–Noise Coupling in CMOS Mixed–Signals LSIs", *IEICE Trans. Fundamentals,* E80–A, 263–275 (Feb., 1997).

Val, et al., "The 3D Interconnection—Applications for Mass Memories and Microprocessors", ISHIM 1991 Proceedings of the International Symposium on Microelectronics, 62–68 (1991).

Vittal, A., et al., "Clock Skew Optimization for Ground Bounce Control", 1996 IEEE/ACM International Conference on Computer–Aided Design, Digest of Technical Papers, San Jose, CA, 395–399 (Nov. 10–14, 1996).

Yan, R., et al., "Reducing Operating Voltage from 3, 2, to 1 Volt and Below—Challenges and Guidelines for Possible Solutions", Proceedings of the IEEE IEDM PLUS CODE 95 IS NOT DEFINED, 55–58 (1995).

* cited by examiner ical circuits. More particularly, the present invention relates to stacked integrated circuits.

MIXED-MODE STACKED INTEGRATED CIRCUIT WITH POWER SUPPLY CIRCUIT PART OF THE STACK

FIELD OF THE INVENTION

The present invention relates generally to integrated circuits. More particularly, the present invention relates to stacked integrated circuits.

BACKGROUND

Integrated circuits form the basis for many electronic systems. Essentially, an integrated circuit (IC) includes a vast number of transistors and other circuit elements that are formed on a single semiconductor wafer or chip and are interconnected to implement a desired function. The complexity of these integrated circuits requires the use of an ever increasing number of linked transistors and other circuit elements. As the number of transistors involved increases, the integrated circuitry dimensions shrink. One challenge in the semiconductor industry is to develop improved methods for electrically connecting and packaging circuit devices that are fabricated on the same and on different wafers or chips. It is an objective in the semiconductor industry to construct transistors that occupy less surface area on the silicon chip or die.

Many electronic systems are created through the use of a variety of different ICs, each of which performs one or more specific functions. For example, computer systems include at least one microprocessor and a number of memory chips. Conventionally, each of these ICs is formed on a separate wafer or chip, packaged independently and interconnected on, for example, a printed circuit board.

As IC technology progresses, there is a growing desire for a "system on a chip," in which the functionality of all of the ICs of the system are packaged together without a conventional printed circuit board. Ideally, such a computing system would be fabricated with all the necessary ICs on one wafer, as compared with conventional methods of fabricating many chips of different functions and packaging them to form a complete system. Such a structure would greatly improve IC performance and provide higher bandwidth.

In practice, however, it is very difficult with conventional technology to implement a truly high-performance "system on a chip" because of the vastly different fabrication processes and different manufacturing yields for the logic and memory circuits. As a compromise, various "system modules" have been introduced that electrically connect and package IC devices that are fabricated on the same or on different semiconductor wafers. Initially, system modules were created by simply stacking two semiconductor chips, e.g., a logic chip and a memory chip, one on top of the other in an arrangement commonly referred to as chip-on-chip (COC) structure. Chip-on-chip structures most commonly use micro bump bonding (MBB) technology to electrically connect the working surfaces of two chips. Several problems, however, remain inherent with this design structure. For example, this approach is limited in the number of chips that can be interconnected as part of the system module.

Several approaches to assembling memory chips to form a high-density memory cube have been explored. In one technique, stacked chips are vertically interconnected using gold wire bonding. The chips are epoxy bonded to tapes, and the wires between the chip and the tape are trimmed with a diamond saw. For parallel computing applications, a central processing unit (CPU) can be surrounded by cache memory chips. Each memory die is located in its own cavity on the package substrate, which is formed from low-temperature co-fired ceramic (LTCC). Another approach uses a three-dimensional vertical module structure that consists of single chip modules that are constructed from mass-produced memory devices. A multi-chip architecture for use in a reduced instruction set computer (RISC) consists of a base substrate having a deposited organic film on a laminated printed circuit board, a glass-ceramic-based organic thin film multilayer build-up chip scale package (CSP), and a glass-ceramic three-dimensional memory module. Still another approach integrates both COC and chip-on-board (COB) architectures into a single three-dimensional package.

Other proposals have been developed for interconnecting a number of chips in a stack to form a system module. However, these modules suffer from additional problems. For example, some modules use chip carriers that make the packaging bulky. Further, others use wire bonding that gives rise to stray inductances that interfere with the operation of the system module.

Another issue of particular importance with respect to stacked IC design is power consumption. In the context of limited-power environments, such as portable devices, power consumption considerations are especially critical. To reduce power consumption, efforts have been made to reduce the operating voltage of devices. Reducing the operating voltage of analog circuits, however, reduces their dynamic range and degrades high-frequency characteristics. One solution to this problem is to use large scale integrated circuits (LSIs) that have multiple operating voltages. For example, according to one conventional approach, power supply components, such as high-efficiency DC-to-DC converters, are integrated into the same chip so as to provide multiple operating voltages, such as a low voltage core for use with digital circuitry and a higher voltage rim for devices that use a higher operating voltage.

Reducing the size of the DC-to-DC converters is desirable to conserve device space for other components. A typical DC-to-DC converter includes semiconductor devices, magnetic components, e.g., transformers and inductors, resistors, and capacitors. FIG. 11 depicts a conventional DC-to-DC converter 1100 consisting of a silicon substrate 1102, on which a rectifier 1104, a capacitor 1106, a switch 1108, and control circuitry are formed in a semiconductor device region 1112. A thin-film inductor 1114 is formed on the silicon substrate 1102 outside of the semiconductor device region 1112.

An effective way of reducing the size of a DC-to-DC converter is to reduce the size of the magnetic components in the converter. This approach increases reliability and operating frequency, allowing for a reduced number of parts and a shortened length of wire bonding. As a result, the power supply component can be formed with a smaller size. Power dissipation is also reduced.

A single-chip DC-to-DC converter involves integration of semiconductor devices and magnetic devices on a single chip. One approach to realizing this goal is to fabricate a thin-film magnetic component on a silicon substrate, thus allowing semiconductor devices based on silicon technology to be integrated with magnetic components. The use of planar magnetic elements as inductors or transformers is known in the art. FIGS. 12 and 13 respectively depict a schematic diagram and a circuit diagram of a planar microtransformer 1200 with monolithically integrated rectifier diodes 1202 on a silicon substrate 1204 fabricated using a dry process. The microtransformer 1200 can be formed using, for example, thin film deposition using chemical vapor deposition or sputtering and ion beam etching or reactive ion etching. A transformer 1206 is formed by a copper primary coil 1208 and a copper secondary coil 1210 wrapped around a transformer core 1212 of a ternary alloy of CoZrRe.

The fabrication process itself introduces certain obstacles to improving the efficiency of thin-film magnetic devices. For example, their inductance or Q factor should be increased, and their equivalent resistance should be reduced. For applications in which these characteristics are critical, inductors having larger dimensions can be fabricated by micromachining or fabricated on other, smaller, silicon wafers and mounted on the power supply integrated circuit die.

Accordingly, it is desirable to develop an improved structure and method for interconnecting ICs of different types, including those implementing digital, analog, and RF functions, on separate chips or wafers in a system module.

SUMMARY OF THE INVENTION

The above mentioned problems with ICs and other problems are addressed by the present invention and will be understood by reading and studying the following specification. System modules are described that include a stack of interconnected semiconductor chips, wafers, or dies. The semiconductor dies are interconnected by micro bump bonding (MBB) of coaxial conductors that extend through the thickness of the various dies. One of the semiconductor chips includes power supply and power conditioning circuitry that is operable to generate multiple operating voltages. The coaxial conductors are selectively connected to ICs housed within the dies so as to provide each IC with an appropriate one of the multiple operating voltages. Digital memory and logic dies are thus interconnected with analog and/or radio frequency (RF) dies, such that digital, analog, and/or RF functions are incorporated in a single package.

Methods of making these circuits and devices, all of which use vertically stacked integrated circuit dies, are also disclosed. Still further and other embodiments, advantages, and aspects of the present invention will become apparent upon reading the following detailed description, and by reference to the drawings.

BRIEF DESCRIPTION OF THE DRAWINGS

In the drawings, like numerals denote substantially similar components throughout the several views.

Figure 1:
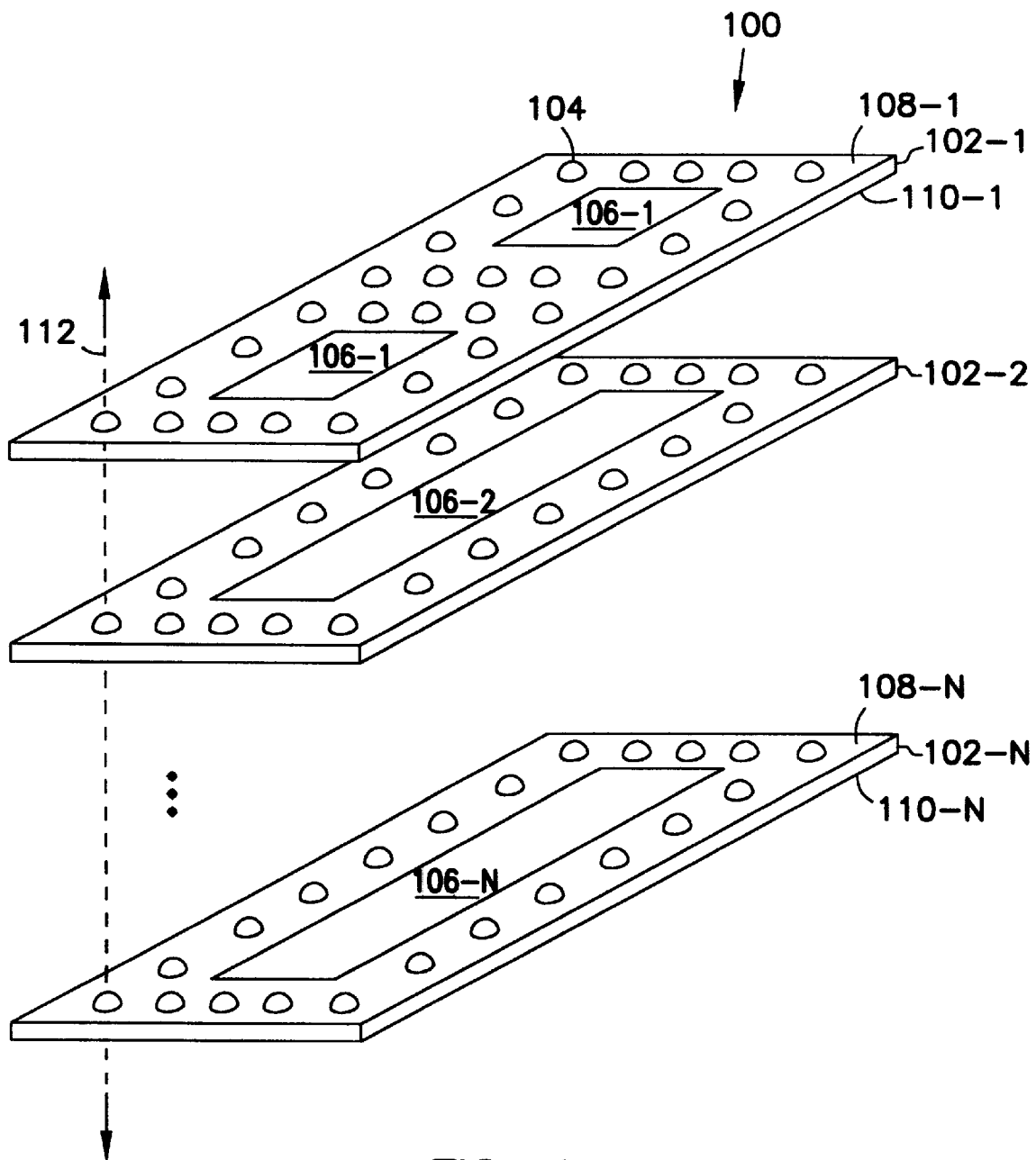
FIG. 1 is an exploded view of a mixed-mode integrated circuit arrangement having multiple vertically stacked integrated circuit chips, according to one particular embodiment of the present invention.

The invention is amenable to various modifications and alternative forms. Specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

In the following detailed description, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

In the following description, the terms chip, die, wafer and substrate are interchangeably used to refer generally to any structure, or portion of a structure, on which integrated circuits are formed, and also to such structures during various stages of integrated circuit fabrication. The terms include doped and undoped semiconductors, epitaxial layers of a semiconductor on a supporting semiconductor or insulating material, combinations of such layers, as well as other such structures that are known in the art.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

I. System Module

FIG. 1 is a perspective view of an embodiment of a system module, indicated generally at 100, according to the teachings of the present invention. System module 100 includes a plurality of semiconductor chips 102-1, . . . , 102-N that are disposed and interconnected in a stack to provide "chip-sized" packaging. Each semiconductor chip 102-1, . . . , 102-N includes integrated circuits 106-1, . . . , 106-N, respectively. In one embodiment, semiconductor chips 102-1, . . . , 102-N comprise semiconductor dies with circuits that perform different functions. For example, a semiconductor chip 102-2 might comprise a semiconductor die with a memory circuit, such as a dynamic random access memory (DRAM) circuit. Likewise, the chip 102-2 can include a static random access memory (SRAM) type chip or flash electronically erasable program read only memory (flash EEPROM) type chip. Other semiconductor chips 102 might implement, for example, digital logic, analog, and radio frequency (RF) functions.

Implementing different functions within a single IC module involves the use of different power supply voltages. Digital IC logic and memory circuits with submicron devices, for example, may require voltages as low as 1.0 V. Radio frequency (RF) and analog circuits, on the other hand, do not operate well with such lower power supply voltages. These types of circuits might operate best, for example, with 3.3 V power supplies. In addition, circuits that have different functions and that are mounted on the same substrate or utilize the same power supply sources or voltages can create crosstalk through power supply distribution lines through ground planes and lines, as well as through common substrates or substrate noise. To minimize crosstalk, effective isolation is achieved by mounting the circuits on different IC dies.

To provide the different operating voltages used by the various types of circuits, the topmost IC chip 102-1 serves as an interposer on which power supply and power conditioning, e.g., DC-to-DC converter, circuitry 106-1 is fabricated. The power supply and power conditioning circuitry 106-1 generates multiple supply voltages, which are selectively provided to the other IC chips 102 such that each IC 106 receives an appropriate operating voltage.

The system module 100 uses microbumps 104 to interconnect the ICs 106-1, . . . , 106-N. In one embodiment, the microbumps 104 comprise controlled-collapse chip connections (C-4) solder pads. Other appropriate materials can be used to form microbumps 104. Microbumps 104 are formed on first sides 108-1, . . . , 108-N and second sides 110-1, . . . , 110-N of semiconductor chips 102-1, . . . , 102-N. The microbumps 104 are connected to coaxial conductors, described in more detail below, to carry signals between semiconductor wafers 102-1, . . . , 102-N. Microbumps 104 are selectively formed using, for example, a vacuum deposition through a mask. The deposited material is then reflowed to homogenize lead and tin as the microbumps. Selected microbumps 104 are aligned and bonded, e.g., the microbumps indicated by arrow 112, by bringing the respective microbumps 104 into contact at an appropriate temperature.

II. Coaxial Conductors and Microbumps

Figure 2:
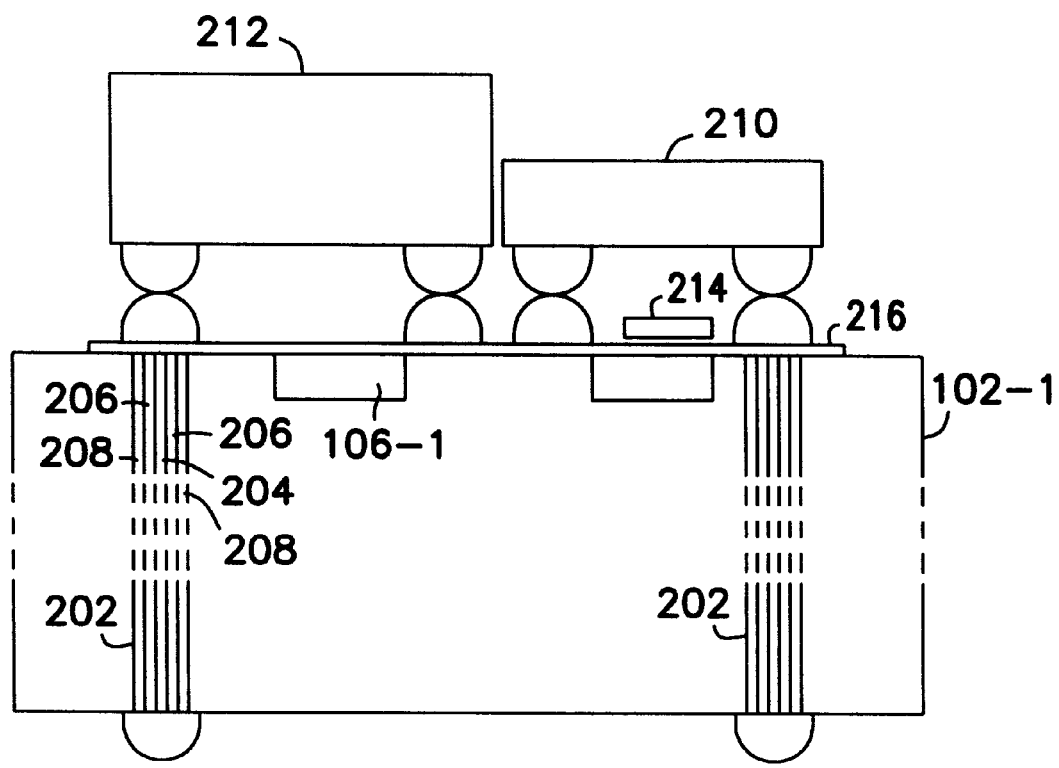
FIG. 2 is a sectional view of a portion of the mixed-mode integrated circuit arrangement depicted in FIG. 1.

FIG. 2 is a cross sectional view of the semiconductor chip 102-1 of FIG. 1, according to an embodiment of the present invention. Semiconductor chip 102-1 includes coaxial conductors 202 that are formed in high aspect ratio vias through the thickness of semiconductor chip 102-1. The coaxial conductors 202 have an aspect ratio in the range of approximately 100 to 200. Conventionally, a semiconductor wafer used to form an integrated circuit has a thickness in the range of approximately 500 to 1000 microns. Thus, the high aspect ratio vias can be fabricated with a width that is in the range from approximately 2.5 microns up to as much as approximately 10 microns.

The power supply and power conditioning circuitry 106-1 supply multiple operating voltages to accommodate the various power requirements of the different types of circuitry formed on the IC chips 102-2, . . . , 102-N. In one particular implementation, the circuitry 106-1 includes thick film capacitors 210 and/or inductors and transformers 212 mounted on the front surface 108-1 of the IC chip 102-1. Additionally, thin film inductors and transformers 214 and capacitors (not shown) can be fabricated directly on the surface 108-1. It should be noted that the power supply circuitry can employ different types of devices than those used in the other IC chips 102. For example, the power supply circuitry can include transistors having larger dimensions and higher breakdown voltages than those used in the other IC chips 102, as well as specialized devices, such as Schottky barrier diodes used as rectifier diodes. In general, the power supply circuitry can incorporate lower-cost, older technology as compared to micron-size devices because it is of relatively low density.

Power is supplied to the various ICs 106 by coaxial conductors 202. Each coaxial conductor 202 includes a center conductor 204 that is surrounded by an insulator 206, e.g., oxide. Further, an outer conductor 208 surrounds the insulator 206. One of the coaxial conductors 202 is shown in cross section in FIG. 3. Outer conductor 208 comprises, for example, a metal layer that is deposited within the high aspect ratio via. Alternatively, outer conductor 208 may comprise a portion of the semiconductor chip 102-1 that has been doped with impurities to render it conductive.

The coaxial conductors 202 provide different power supply voltages to the various IC chips 102. For example, one coaxial conductor 202 may carry a supply voltage of 1.0 V to the memory and logic portions of the package. A different coaxial conductor 202, on the other hand, may carry a higher supply voltage, e.g., 3.3 V, to analog and RF circuitry. As a result, a single package is capable of mixed-mode operation and can incorporate both analog and digital functions.

The coaxial conductors 202 are selectively coupled to the ICs 106 using a metallization layer 216. Further, microbumps 104 are formed outwardly from the metallization layer 216 to provide for interconnection with other semiconductor wafers in a stack to form a system module.

Advantageously, coaxial conductors 202 allow a number of semiconductor wafers to be interconnected in a stack with an increased density over other system modules. The space between semiconductor wafers in system module 100 is on the order of a few microns, e.g., the thickness of two bonded, solder microbumps. Assuming a wafer thickness on the order of 750 microns, eight semiconductor wafers can be stacked to form a system module with a thickness on the order of 6 millimeters. This compact system module can be readily mounted into a variety of system packages.

The use of microbumps to interconnect the semiconductor wafers in a stack provides additional advantages. For example, stray capacitance, stray inductance and series resistance are all reduced over other system modules. This ultimately results in improved performance.

Figure 3:
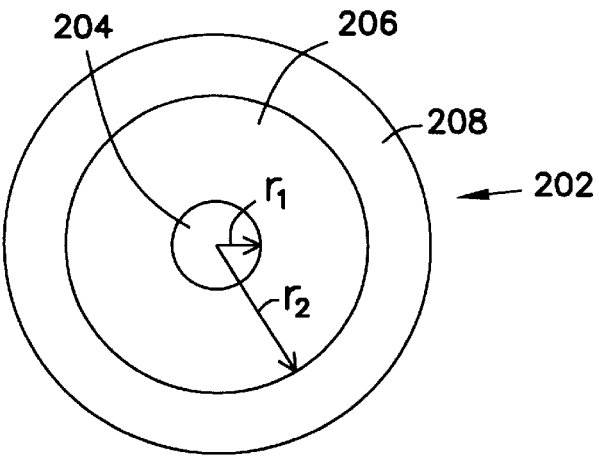
FIG. 3 is a cross sectional view of an embodiment of a coaxial conductor.

The coaxial conductor 202 shown in FIGS. 2 and 3 have, for simplicity, a geometry such that:

$$\frac{1}{\pi}\ln\left(\frac{r_2}{r_1}\right) = 1$$

In this case, the capacitance C of coaxial conductor is:

$$C = 2\frac{\pi}{\ln\left(\frac{r_2}{r_1}\right)}e_r e_0 l$$

The term $e_r e_0$ is the electric permittivity of insulator layer 206 and l is the length of coaxial conductor 202. If insulator layer 206 is silicon dioxide and the coaxial conductor has a length of approximately 750 microns, then the capacitance is approximately 50 femtofarads (fF). Likewise, the inductance L can be calculated as follows:

$$L = \mu_0\left(\frac{1}{2\pi}\right)\ln\left(\frac{r_2}{r_1}\right)l$$

In this equation, $\mu_0$ is the magnetic permeability of free space. Continuing with the same assumptions, this provides an inductance on the order of 0.5 nanohenries (nH). These values are less than those associated with a conventional wire bond, e.g., 500 to 1000 fF and 1–2 nH. Further, the large stray capacitances and inductances (1–7 picofarads (pF) and 2–35 nH) associated with a package and even larger capacitances and inductances associated with a printed circuit board are avoided.

The microbumps of system 100 have only a small stray capacitance, e.g., 100 to 500 fF, and a small inductance of less than 0.1 nH. The net result is that the interconnection between the semiconductor chips 102-1, . . . , 102-N of system 100 can be made with about the same stray capacitance and inductance as that of a single wire bond. Alternative connection techniques would require significantly more wire bonds and huge stray inductances and capacitances associated with the packaging and even larger strays associated with interconnection of the packages.

Coaxial conductors 202 can be added to circuits using a conventional layout for the circuit without adversely affecting the surface area requirements of the circuit. Conventional circuits typically include pads formed on the top surface of the semiconductor wafer that are used to connect to various signals for the system. The bond wires of conventional circuits can be replaced by coaxial conductors 202 and microbumps 104 to achieve the advantages described above.

III. Formation of Coaxial Conductors and Microbumps

FIGS. 4, 5, 6, 7, 8, and 9 are elevational views of a semiconductor chip 102-I at various points of an illustrative embodiment of a method for forming an IC with coaxial conductors according to the teachings of the present invention. A functional circuit 402 is formed in an active region of semiconductor wafer 400. In one embodiment, semiconductor wafer 400 comprises a monocrystalline silicon wafer. For purposes of clarity, the figures only show the formation of two coaxial conductors through semiconductor wafer 400. However, it is understood that with a particular functional circuit any appropriate number of vias can be formed through semiconductor wafer 400. For example, hundreds of vias may be needed for a conventional dynamic random access memory (DRAM). Essentially, the coaxial conductors are formed in the same space on the surface of semiconductor wafer 400 that is conventionally used to form bond pads to be connected to leads. The coaxial conductors replace the conventional bond wires which couple the bond pads to selected leads of a lead frame in the packaging of the semiconductor wafer.

Figure 4:
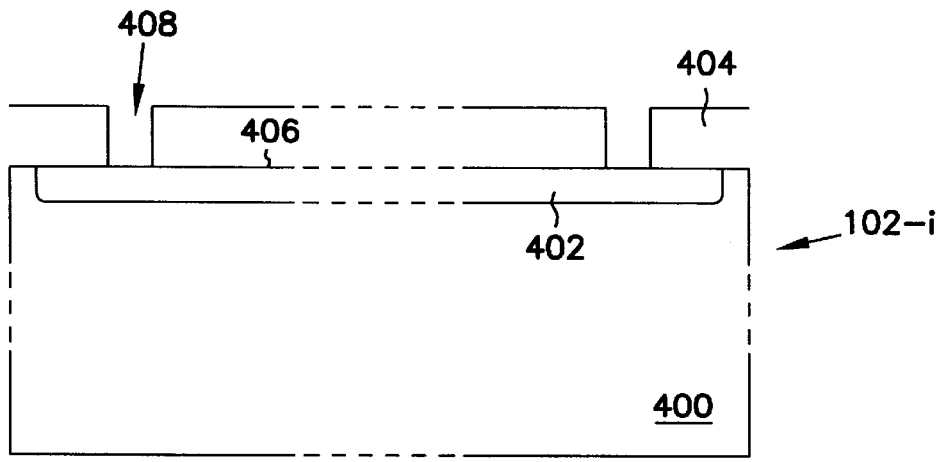
FIGS. 4, 5, 6, 7, 8, and 9 are elevational views of a semiconductor wafer at various points of an illustrative embodiment of a method according to the teachings of the present invention.

As shown in FIG. 4, a photoresist layer 404 is formed on surface 406 of semiconductor substrate 400. The photoresist layer 404 is patterned to provide openings 408 at points on surface 406 where high aspect ratio holes are to be formed through semiconductor wafer 400.

Figure 5:
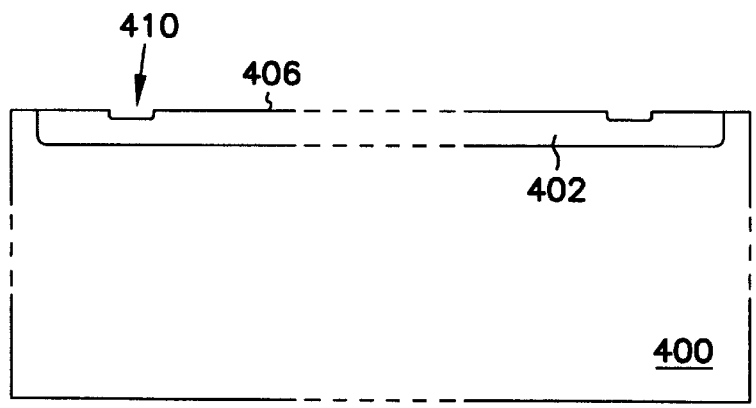

As shown in FIG. 5, etch pits 410 are formed by conventional alkaline etching through openings 408 in photoresist layer 404. Photoresist layer 404 is then removed.

Figure 6:
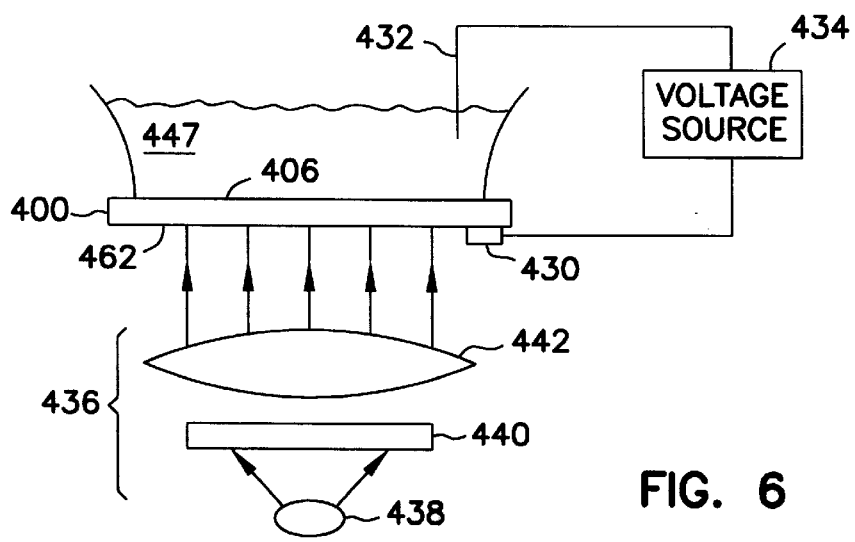
Figure 7:
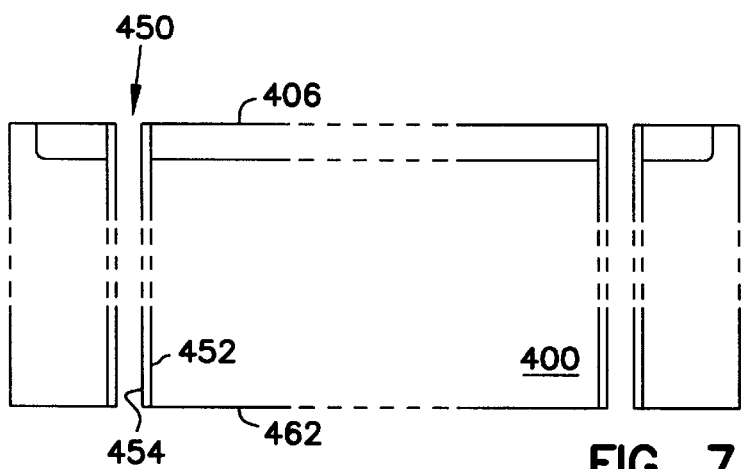

FIG. 6 is a schematic diagram that illustrates an embodiment of a layout of equipment used to carry out an anodic etch that is used to form high aspect ratio holes 450 of FIG. 7. Typically, holes 450 have an aspect ratio in the range of 100 to 200. Bottom surface 462 of semiconductor wafer 400 is coupled to voltage source 434 by positive electrode 430. Further, negative electrode 432 is coupled to voltage source 434 and is placed in a bath of 6% aqueous solution of hydrofluoric acid (HF) on surface 406 of semiconductor wafer 400.

In this example, illumination equipment 436 is also included because semiconductor wafer 400 is n-type semiconductor material. When p-type semiconductor material is used, the illumination equipment is not required. Illumination equipment 436 assures that there is a sufficient concentration of holes in semiconductor wafer 400 as required by the anodic etching process. Illumination equipment 436 includes lamp 438, IR filter 440, and lens 442. Illumination equipment 436 focuses light on surface 462 of semiconductor wafer 400.

In operation, the anodic etch etches high aspect ratio holes through semiconductor wafer 400 at the location of etch pits 410. Voltage source 434 is turned on and provides a voltage across positive and negative electrodes 430 and 432. Etching current flows from positive electrode 430 to surface 406. This current forms the high aspect ratio holes through semiconductor wafer 400. Further, illumination equipment illuminates surface 462 of semiconductor wafer 400 so as to assure a sufficient concentration of holes for the anodic etching process. The size and shape of the high aspect ratio holes through semiconductor wafer 400 depends on, for example, the anodization parameters such as HF concentration, current density, and light illumination. An anodic etching process is described in V. Lehmann, *The Physics of Macropore Formation in Low Doped n-Type Silicon*, J. Electrochem. Soc., Vol. 140, No. 10, pp. 2836–2843, October 1993, which is incorporated herein by reference.

FIG. 7 illustrates the formation of the outer conductor 454 of a coaxial conductor. Outer conductor 454 can be formed in at least one of two ways. First, outer conductor 454 can be formed using a low pressure chemical vapor deposition of tungsten in a self-limiting process which provides a tungsten film on inner surface 452 of holes 450 by silicon reduction. Accordingly, silicon material within holes 450 is replaced by tungsten atoms in a $WF_6$ reaction gas. A reaction product, $SiF_4$ is pumped out or otherwise removed from the reaction chamber. This can be followed by a silane or polysilane reduction of the $WF_6$ until a desired thickness is achieved. Deposition rates for this process are dependent on temperature and reaction gas flow rate. Deposition rates of 1 micron per minute have been observed at temperatures of 300° C. and with a flow rate of $WF_6$ at 4 sccm in a cold wall CVD reactor.

Alternatively, outer conductor 454 can be formed as diffusion regions within semiconductor wafer 400 along inner surface 450. To accomplish this, surfaces 406 and 462 are masked by a masking layer and conductivity enhancing impurities are introduced. The impurities form outer conductor 454 as, for example, n+ regions.

Figure 8:
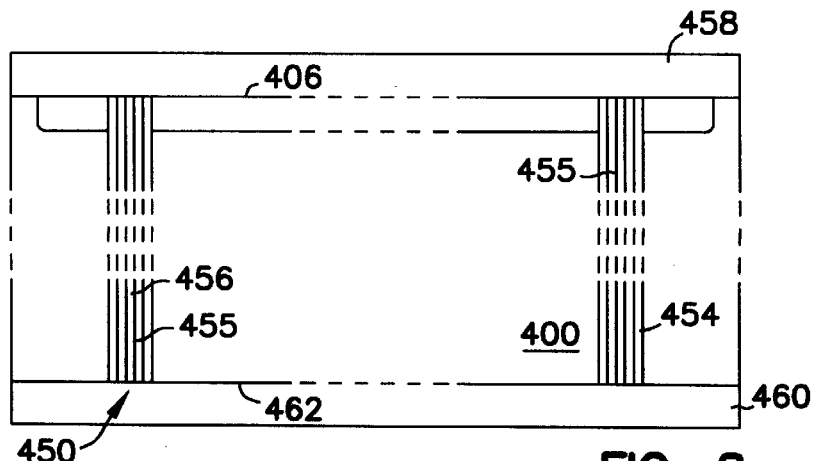
Figure 9:
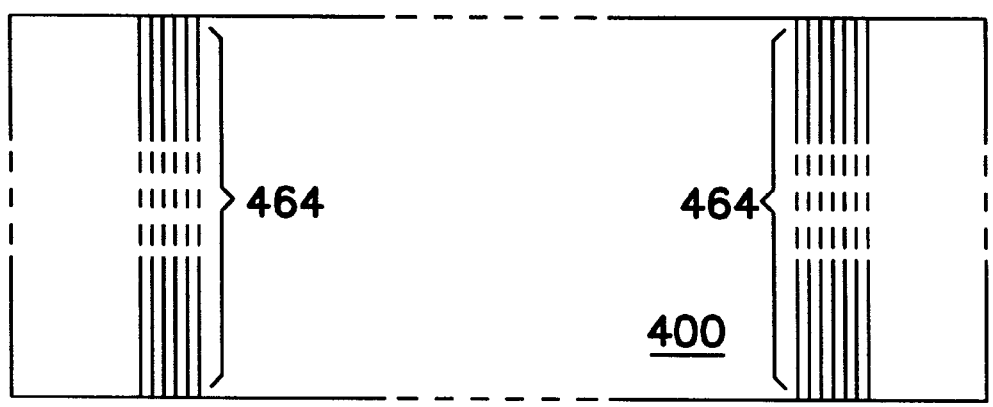

FIGS. 8 and 9 illustrate the completion of the coaxial conductors. First, an insulator material, e.g., silicon dioxide, is formed in holes 450 along the length of outer conductor 454 to form insulator layer 455. Insulator layer 455 is formed so as to leave an opening extending through the thickness of semiconductor wafer 400.

Next, a process of aluminum/polysilicon substitution is used to fill the remaining portion of holes 450 with aluminum. Such a process is described in H. Horie et al., *Novel High Aspect Ratio Aluminum Plug for Logic/DRAM LSIs Using Polysilicon-Aluminum Substitute*, Dig. IEEE Int. Electron Device Meeting, San Francisco, pp. 946–948, 1996, which is incorporated herein by reference. First, hole 450 is filled with a layer of polysilicon 456 by a process of chemical vapor deposition (CVD). It is noted that, conventionally, such a deep trench cannot be filled directly with aluminum using a direct chemical vapor deposition technique. However, conventionally, polysilicon has been deposited in holes with such high aspect ratios, e.g., deep trenches for trench capacitors. Once the holes are filled with polysilicon, excess polysilicon on surface 406 is removed by, for example, chemical/mechanical polishing. Aluminum layers 458 and 460 are deposited on surfaces 406 and 462 using, for example, a sputtering technique used to coat optical disks. Layers 458 and 460 have a thickness on the order of a few microns. The structure shown in FIG. 8 is then annealed at 500 degrees Celsius in Nitrogen ambient. This allows the aluminum material of layers 458 and 460 to be substituted for the polysilicon 456 in holes 450. The displaced polysilicon and any residual aluminum from layers 458 and 460 are removed by, for example, chemical/mechanical polishing. By depositing a thin, e.g, 0.1 $\mu$m, layer of titanium on top of layers 458 and 460 the above mentioned anneal can be reduced from 500° Celsius to 450° Celsius. The structure is now as shown in FIG. 9 with coaxial conductors 464 extending through semiconductor wafer 400.

IV Electronic System

Figure 10:
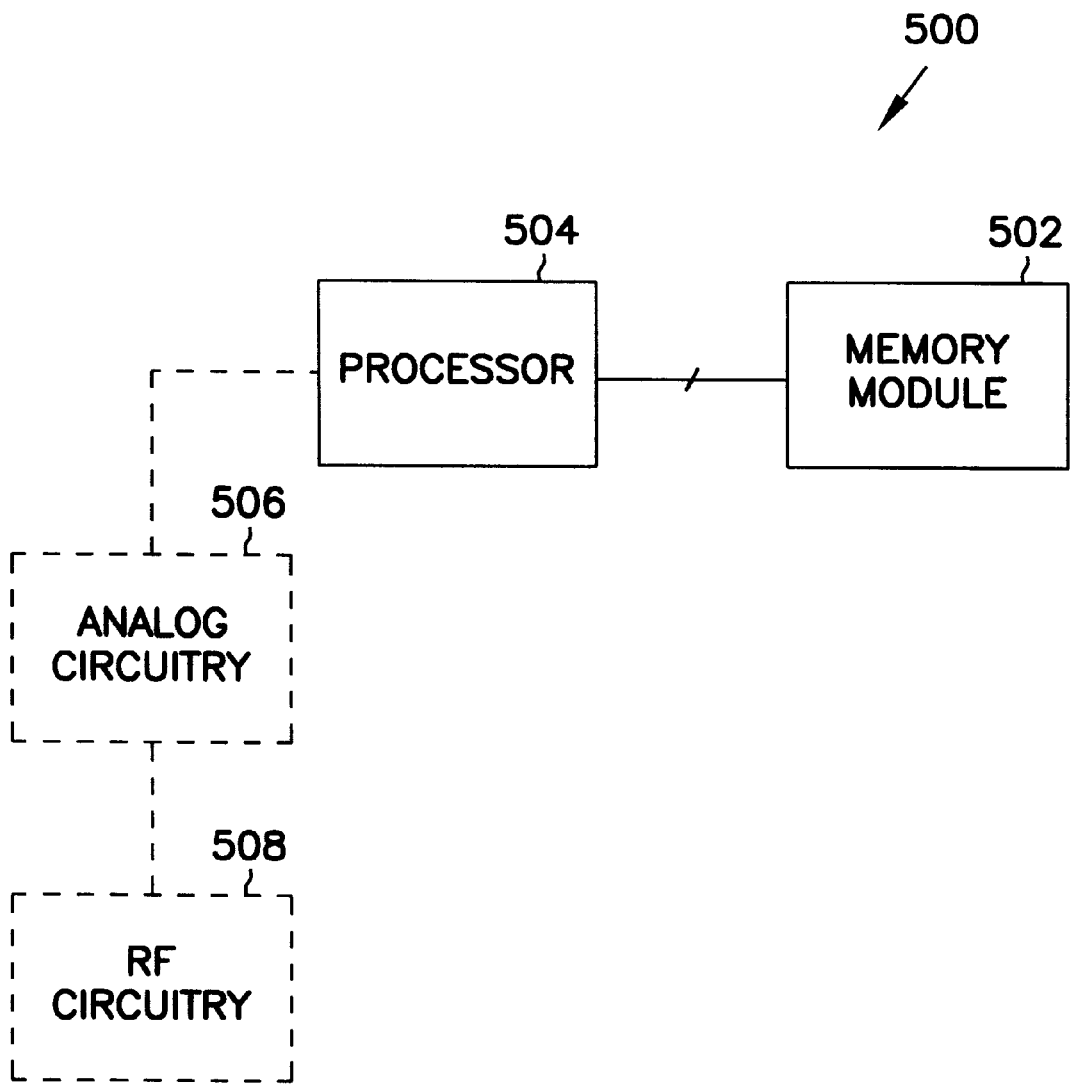
FIG. 10 is a block diagram of an embodiment of an electronic system according to the teachings of the present invention.
Figure 11:
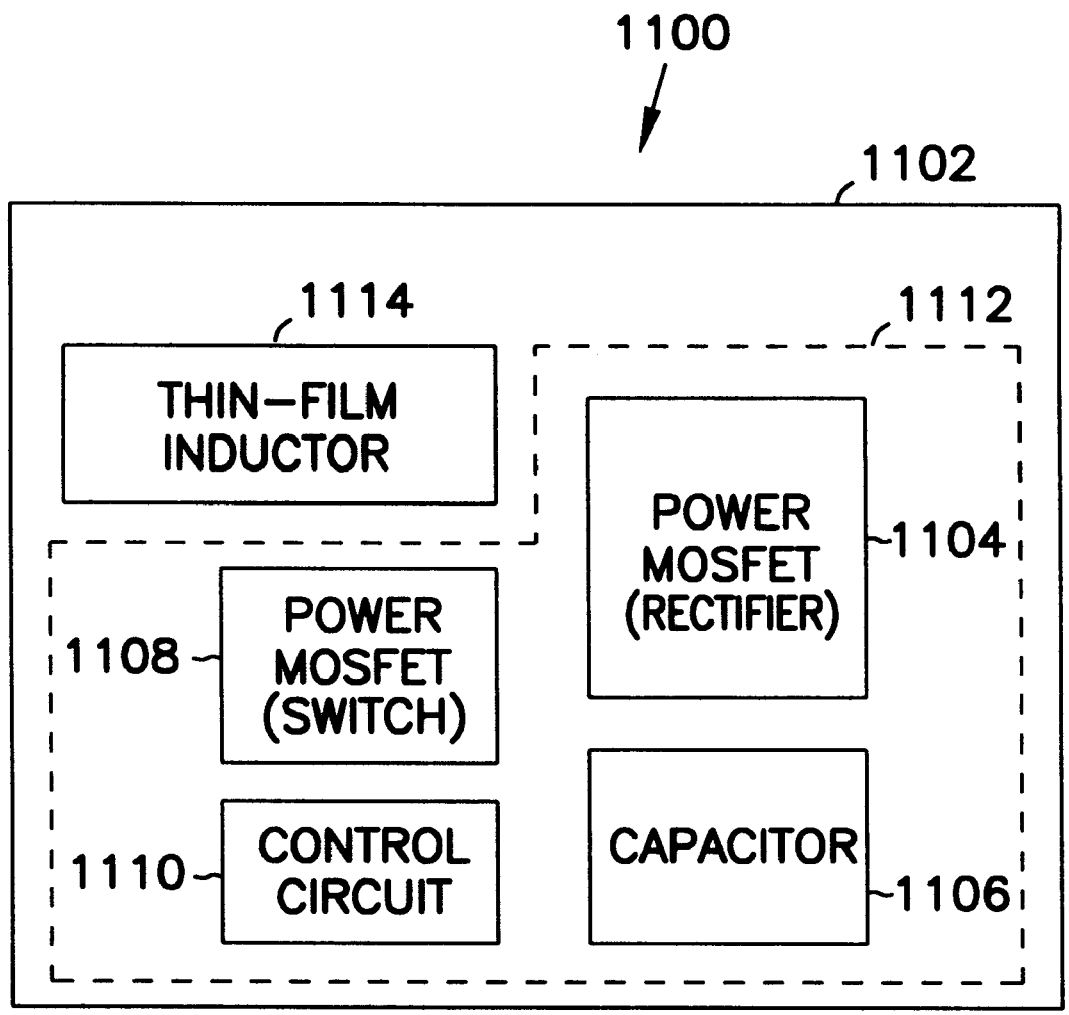
FIG. 11 is a block diagram illustrating a conventional DC-to-DC converter.
Figure 12:
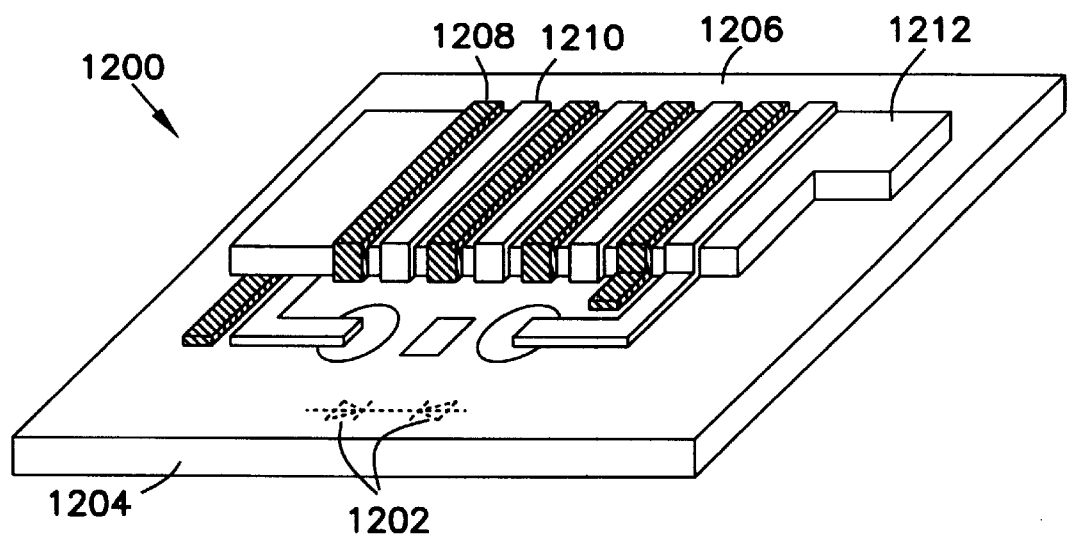
FIGS. 12 and 13 depict a schematic diagram and a circuit diagram, respectively, of a conventional planar microtransformer.
Figure 13:
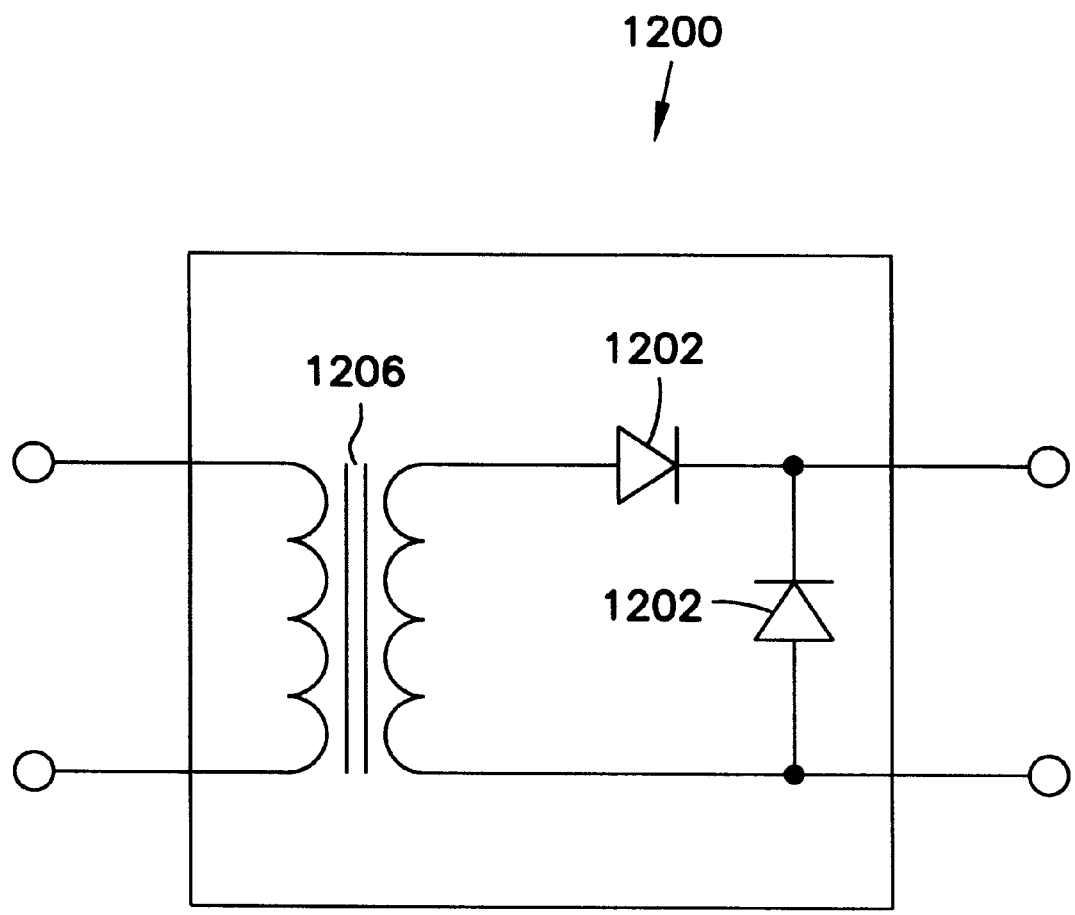

FIG. 10 is a block diagram of an embodiment of an electronic system, indicated generally at 500, and constructed according to the teachings of the present invention. System 500 includes processor 504 and memory module 502. Memory module 502 includes a number of memory circuits that are fabricated on separate semiconductor chips or dies. These dies include a plurality of coaxial conductors that are formed through the thickness of their respective dies as described in more detail above. These coaxial conductors are interconnected with other semiconductor chips using a microbump bonding, e.g., C-4 type microbumps.

CONCLUSION

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention.

What is claimed is:

1. A system module, comprising:
   a plurality of stacked semiconductor chips each including an integrated circuit, one of the stacked semiconductor chips including power circuitry operable for generating a plurality of operating voltages;
   each semiconductor chip including a plurality of vias formed through the thickness of the semiconductor chip;
   a plurality of conductors, each conductor having first and second opposite ends and formed in one of the vias;
   each conductor selectively interconnected with at least one integrated circuit to provide an appropriate one of the plurality of operating voltages; and
   a plurality of microbumps, each microbump formed on an end of a selected conductor so as to interconnect the integrated circuits of the plurality of stacked semiconductor chips.

2. The system module of claim 1, wherein the integrated circuits comprise at least one of a memory circuit, a logic circuit, an analog circuit, and a radio frequency circuit.

3. The system module of claim 1, wherein each conductor comprises a coaxial conductor.

4. The system module of claim 1, wherein the microbumps comprise controlled-collapse chip connections (C-4) solder pads.

5. The system module of claim 1, wherein each conductor comprises:
   an outer conductive layer formed along a wall of a selected via;
   an insulator layer; and
   an inner conductive layer substantially parallel to and separated from the outer conductive layer by the insulator layer.

6. A system module, comprising:
   a plurality of stacked semiconductor chips, a first one of the semiconductor chips including a memory circuit, a second one of the semiconductor chips including a logic circuit, a third one of the semiconductor chips including a power circuit operable for generating a plurality of operating voltages, and at least one additional semiconductor chip including at least one of an analog circuit and a radio frequency circuit;
   each semiconductor chip including a plurality of vias formed through the thickness of the semiconductor chip;
   a plurality of coaxial conductors, each having first and second opposite ends and formed in one of the vias;
   each coaxial conductor selectively interconnected with at least one integrated circuit to provide an appropriate one of the plurality of operating voltages; and
   a plurality of microbumps, each microbump formed on an end of a selected conductor so as to interconnect the circuits of the plurality of stacked semiconductor chips.

7. The system module of claim 6, wherein the microbumps comprise controlled-collapse chip connections (C-4) solder pads.

8. The system module of claim 6, wherein each conductor comprises:
   an outer conductive layer formed along a wall of a selected via;
   an insulator layer; and
   an inner conductive layer substantially parallel to and separated from the outer conductive layer by the insulator layer.

9. The system module of claim 8, wherein the outer conductive layer comprises a layer of doped semiconductor material.

10. The system module of claim 8, wherein the outer conductive layer comprises a metal layer that lines a surface of the via.

11. A system, comprising:
    a first semiconductor chip including a processor circuit;
    a second semiconductor chip including a memory module, communicatively coupled to the processor circuit; and
    at least one additional semiconductor chip including at least one of an analog circuit and a radio frequency circuit, communicatively coupled to the processor circuit,
    the first, second, and at least one additional semiconductor chips coupled in a stack by microbump bonding and coaxial conductors that extend through the thickness of the semiconductor chips, the coaxial conductors arranged to provide each circuit with an appropriate one of a plurality of operating voltages.

12. The system of claim 11, wherein a plurality of microbumps are each formed on an end of a selected conductor so as to interconnect the circuits of the plurality of stacked semiconductor chips.

13. The system of claim 12, wherein the microbumps comprise controlled-collapse chip connections (C-4) solder pads.

14. The system of claim 11, wherein each coaxial conductor comprises:
- an outer conductive layer formed along a wall of a selected via;
- an insulator layer; and
- an inner conductive layer substantially parallel to and separated from the outer conductive layer by the insulator layer.

15. The system of claim 14, wherein the outer conductive layer comprises a layer of doped semiconductor material.

16. The system of claim 14, wherein the outer conductive layer comprises a metal layer that lines a surface of the via.

17. A mixed-mode integrated circuit arrangement, comprising:
- a power circuit arrangement formed on a first integrated circuit die and configured and arranged to generate a plurality of operating voltages;
- a plurality of additional integrated circuit dies having additional circuit arrangements formed thereon, the first and additional integrated circuit dies being vertically stacked; and
- at least one coaxial connector coupled to the power circuit arrangement and arranged to provide an appropriate one of the plurality of operating voltages to each of the circuit arrangements formed on the additional integrated circuit dies.

18. The mixed-mode integrated circuit arrangement of claim 17, wherein the additional circuit arrangements comprise a digital memory and a digital logic circuit arrangement.

19. The mixed-mode integrated circuit arrangement of claim 17, wherein the additional circuit arrangements comprise an analog circuit.

20. The mixed-mode integrated circuit arrangement of claim 17, wherein the additional circuit arrangements comprise a radio frequency circuit.

21. The mixed-mode integrated circuit arrangement of claim 17, wherein the power circuit arrangement comprises a power supply circuit and a power conditioning circuit.

22. The mixed-mode integrated circuit arrangement of claim 21, wherein the power conditioning circuit comprises a DC-to-DC converter.

23. The mixed-mode integrated circuit arrangement of claim 21, wherein the power supply circuit comprises at least one of a thick film capacitor, a thick film inductor, and a thick film transformer mounted on a top surface of the first integrated circuit die.

24. The mixed-mode integrated circuit arrangement of claim 21, wherein the power supply circuit comprises at least one of a thin film capacitor, a thin film inductor, and a thin film transformer formed on a top surface of the first integrated circuit die.

25. The mixed-mode integrated circuit arrangement of claim 17, wherein the power circuit arrangement comprises a Schottky barrier diode.

26. The mixed-mode integrated circuit arrangement of claim 17, wherein the integrated circuit dies have microbumps formed thereon and arranged to provide connectivity between the integrated circuit dies.

27. A mixed-mode integrated circuit device, comprising:
- a first integrated circuit die having power circuitry formed thereon, the power circuitry configured and arranged to generate a plurality of operating voltages;
- a second integrated circuit die having a digital memory circuit arrangement formed thereon;
- a third integrated circuit die having a digital logic circuit arrangement formed thereon; and
- at least one coaxial connector coupled to the power circuitry and arranged to provide an appropriate one of the plurality of operating voltages to each of the digital memory circuit arrangement and the digital logic circuit arrangement,
- the first, second, and third integrated circuit dies being vertically stacked.

28. The mixed-mode integrated circuit device of claim 27, further comprising a fourth integrated circuit die having a radio frequency circuit arrangement formed thereon and vertically stacked with the first, second, and third integrated circuit dies, wherein the at least one coaxial connector is arranged to provide an appropriate one of the plurality of operating voltages to the radio frequency circuit arrangement.

29. The mixed-mode integrated circuit device of claim 27, further comprising a fourth integrated circuit die having an analog circuit arrangement formed thereon and vertically stacked with the first, second, and third integrated circuit dies, wherein the at least one coaxial connector is arranged to provide an appropriate one of the plurality of operating voltages to the analog circuit arrangement.

30. The mixed-mode integrated circuit device of claim 27, wherein the power circuitry comprises power supply circuitry, DC-to-DC converter circuitry, and a Schottky barrier diode.

31. The mixed-mode integrated circuit device of claim 30, wherein the power supply circuitry comprises at least one of a thick film capacitor, a thick film inductor, and a thick film transformer mounted on a top surface of the first integrated circuit die.

32. The mixed-mode integrated circuit device of claim 30, wherein the power supply circuitry comprises at least one of a thin film capacitor, a thin film inductor, and a thin film transformer formed on a top surface of the first integrated circuit die.

33. The mixed-mode integrated circuit device of claim 27, herein the integrated circuit dies have microbumps formed thereon and arranged to provide connectivity between the integrated circuit dies.

* * * * *